(12) United States Patent
Peng et al.

(10) Patent No.: US 12,094,871 B2
(45) Date of Patent: *Sep. 17, 2024

(54) INTEGRATED CIRCUIT WITH ELECTROSTATIC DISCHARGE PROTECTION

(71) Applicant: TAIWAN SEMICONDUCTOR MANUFACTURING CO., LTD., Hsinchu (TW)

(72) Inventors: Po-Lin Peng, Taoyuan (TW); Yu-Ti Su, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 257 days.

This patent is subject to a terminal disclaimer.

(21) Appl. No.: 17/706,521

(22) Filed: Mar. 28, 2022

(65) Prior Publication Data

US 2022/0223582 A1 Jul. 14, 2022

Related U.S. Application Data

(63) Continuation of application No. 16/943,882, filed on Jul. 30, 2020, now Pat. No. 11,289,472.

(51) Int. Cl.
*H01L 27/02* (2006.01)
*H02H 9/04* (2006.01)

(52) U.S. Cl.
CPC ...... *H01L 27/0285* (2013.01); *H01L 27/0255* (2013.01); *H01L 27/0274* (2013.01); *H02H 9/046* (2013.01)

(58) Field of Classification Search
CPC ............. H01L 27/0285; H01L 27/0274; H01L 27/0255; H02H 9/046
USPC .......................................................... 361/56
See application file for complete search history.

(56) References Cited

U.S. PATENT DOCUMENTS

| | | | |
|---|---|---|---|
| 6,323,676 B1* | 11/2001 | Whitworth ........ | H04L 25/0298 326/86 |
| 6,339,344 B1* | 1/2002 | Sakata ........... | H03K 19/018528 326/115 |
| 7,616,029 B1* | 11/2009 | Andrews ........ | H03K 19/20 327/63 |
| 11,289,472 B2* | 3/2022 | Peng ........... | H01L 27/0274 |

(Continued)

FOREIGN PATENT DOCUMENTS

| CN | 1822501 A | 8/2006 |
|---|---|---|
| CN | 102447249 A | 5/2012 |

(Continued)

*Primary Examiner* — Dharti H Patel
(74) *Attorney, Agent, or Firm* — Maschoff Brennan

(57) ABSTRACT

An integrated circuit includes a diode string, a first transistor, a second transistor, and a third transistor. The diode string is coupled between a first reference voltage pin and an input/output (I/O) pad. A first terminal of the second transistor is coupled to a first node, and a gate terminal of the second transistor is coupled to a second reference voltage pin. In response to a voltage at the first terminal of the second transistor being higher than a voltage at the gate terminal of the second transistor, the second transistor is configured to turn on the third transistor, and the third transistor is configured to transmit a voltage received from the first reference voltage pin to a gate terminal of the first transistor.

20 Claims, 14 Drawing Sheets

(56) References Cited

U.S. PATENT DOCUMENTS

| | | | |
|---|---|---|---|
| 2004/0232492 A1 | 11/2004 | Ker et al. | |
| 2005/0200396 A1* | 9/2005 | Hsu | H01L 27/0266 |
| | | | 327/313 |
| 2006/0152868 A1* | 7/2006 | Ker | H01L 29/732 |
| | | | 257/E29.183 |
| 2010/0140712 A1* | 6/2010 | Russ | H01L 23/60 |
| | | | 326/119 |
| 2012/0081820 A1 | 4/2012 | Chu et al. | |
| 2014/0029143 A1* | 1/2014 | Lim | H03F 3/45233 |
| | | | 330/261 |
| 2014/0167862 A1 | 6/2014 | Khatri et al. | |
| 2015/0326224 A1* | 11/2015 | Park | H03K 19/018507 |
| | | | 327/361 |
| 2016/0211253 A1 | 7/2016 | Tsai | |
| 2017/0221879 A1* | 8/2017 | Wang | H01L 27/0288 |
| 2018/0158533 A1* | 6/2018 | Zhou | G11C 17/18 |
| 2020/0035670 A1* | 1/2020 | Tsai | H02H 9/046 |
| 2020/0075580 A1 | 3/2020 | Lin et al. | |

FOREIGN PATENT DOCUMENTS

| | | | |
|---|---|---|---|
| CN | 102810539 A | 12/2012 | |
| CN | 104885359 A | 9/2015 | |
| CN | 105810667 A | 7/2016 | |
| CN | 107579064 A | 1/2018 | |
| CN | 109149544 A | 1/2019 | |
| CN | 110767649 A | 2/2020 | |
| CN | 110875306 A | 3/2020 | |
| CN | 110957713 A | 4/2020 | |
| TW | 202025436 A | 7/2020 | |

* cited by examiner

INTEGRATED CIRCUIT WITH ELECTROSTATIC DISCHARGE PROTECTION

CROSS REFERENCE

This application is a continuation of U.S. application Ser. No. 16/943,882, filed on Jul. 30, 2020, now U.S. Pat. No. 11,289,472, issued on Mar. 29, 2022, which is herein incorporated by reference.

BACKGROUND

An ESD event produces extremely high voltages and leads to pulses of high current of a short duration that can damage integrated circuit devices. For the ESD protection design of the integrated circuit devices, for example, an ESD primary circuit has been implemented in the industry. Usually, when the ESD event cause an inrush voltage exceeding a threshold voltage of the ESD primary circuit, the ESD primary circuit activates to protest an internal circuit from the inrush voltage. When the threshold voltage of the ESD primary circuit is higher, the ESD primary circuit will be activated later. If the threshold voltage of the ESD primary circuit is too high, the internal circuit might be destroyed because the ESD primary circuit fails to activate fast enough.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
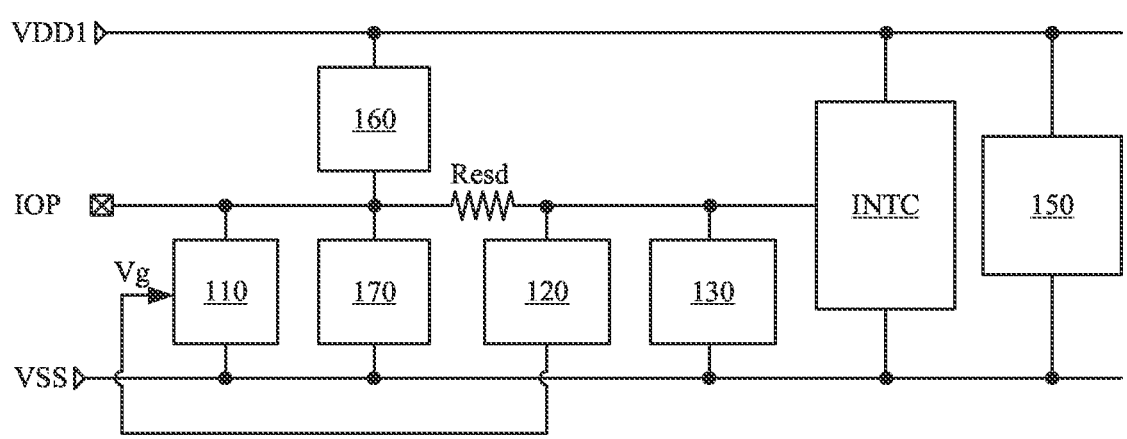
FIG. 1 is a block diagram illustrating an integrated circuit in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Reference is now made to FIG. 1. FIG. 1 is a block diagram illustrating an integrated circuit 100, in accordance with various embodiments. For illustration, the integrated circuit 100 includes an input/output (I/O) pad IOP, an electrostatic discharge (ESD) primary circuit 110, a bias voltage generator 120, an electrostatic discharge secondary circuit 130, a power clamp 150, a pull-up driver 160 and a pull-down driver 170. In some embodiments, the I/O pad IOP is coupled to a terminal of an internal circuit INTC. The I/O pad IOP is configured to transmit an input signal to the internal circuit INTC or carried an output signal from the internal circuit INTC. For instance, the integrated circuit 100 can function as an ESD protection circuit, which protects the pull-up driver 160, pull-down driver 170 and the internal circuit INTC from being damaged by undesired and unpredictable electrostatic discharge event.

As illustratively shown in FIG. 1, the ESD primary circuit 110 is coupled between the I/O pad IOP and a reference voltage pin VSS. In some embodiments, the ESD primary circuit 110 will detect a voltage level on the I/O pad IOP to check whether an ESD event occurs on the I/O pad IOP. When the voltage level on the I/O pad IOP is within a normal range (for example, between about 0V to about 1.8V in some applications), the ESD primary circuit 110 will not activate. When the voltage level on the I/O pad IOP is affected by the ESD event and exceeds a threshold voltage of the ESD primary circuit 110, the ESD primary circuit 110 will activate to guide an ESD current from the I/O pad IOP through the ESD primary circuit 110 to the reference voltage pin VSS. Further details about the ESD primary circuit 110 will be discussed in the following paragraphs.

For illustration, in some embodiments, the pull-up driver 160 is coupled between another reference voltage pin VDD1. In some embodiments, the reference voltage pin VDD1 is configured to carry a post-driver high voltage VDDPST, which is a high voltage utilized outside the internal circuit INTC. For example, the reference voltage pin VDD1 can be configured at about 1.8V. The pull-up driver 160 is used to pull up the voltage level of the I/O pad IOP if needed.

For illustration, in some embodiments, the pull-down driver 170 is coupled between the reference voltage pin VSS. In some embodiments, the reference voltage pin VSS is configured to carry a low voltage or a ground voltage. For example, the reference voltage pin VSS can be configured at about 0V. The pull-down driver 170 is used to pull low the voltage level of the I/O pad IOP if needed.

For illustration, in some embodiments, the power clamp 150 is coupled between the reference voltage pin VDD1 and the reference voltage pin VSS. When an ESD event occurs between the reference voltage pin VDD1 and the reference voltage pin VSS, the power clamp 150 will activate to clamp the voltage difference between the reference voltage pin VDD1 and the reference voltage pin VSS, in order to protect the internal circuit INTC.

As illustratively shown in FIG. 1, the bias voltage generator 120 is coupled to the I/O pad IOP and the ESD primary circuit 110. The bias voltage generator 120 is configured to provide a gate bias signal Vg to the ESD primary circuit 110, and the gate bias signal Vg will contribute to reduce the threshold voltage of the ESD primary circuit 110, such that the ESD primary circuit 110 can activate faster in response to that the ESD event occurs. Further details about the bias voltage generator 120 and the gate bias signal Vg will be discussed in the following paragraphs.

Figure 2A:
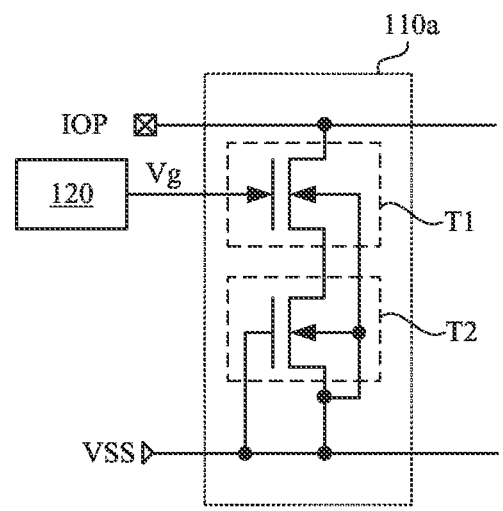
FIG. 2A is a layout diagram illustrating an ESD primary circuit in accordance with various embodiments.
Figure 2B:
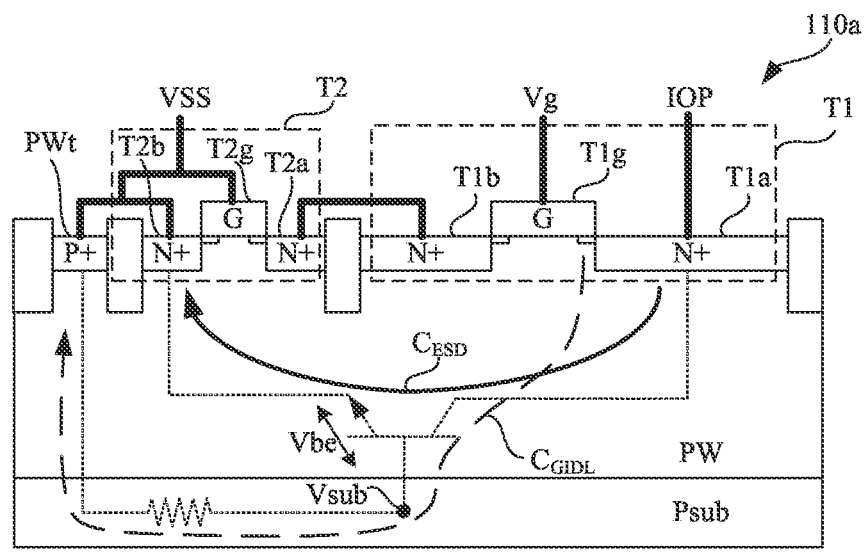
FIG. 2B is a sectional view of the ESD primary circuit in FIG. 2A in accordance with some embodiments.

Reference is now made to FIG. 2A and FIG. 2B. FIG. 2A is a layout diagram illustrating an ESD primary circuit 110a, in accordance with various embodiments. The ESD primary circuit 110a illustrated in FIG. 2A is given for illustrative purposes as one of embodiments of the ESD primary circuit 110 in FIG. 1. FIG. 2B is a sectional view of the ESD primary circuit 110a in FIG. 2A, in accordance with some embodiments. With respect to the embodiments of FIG. 1, like elements in FIG. 2A and FIG. 2B are designated with the same reference numbers for ease of understanding.

For illustration, as illustrated in FIG. 2A and FIG. 2B, the ESD primary circuit 110a includes two N-type transistors T1 and T2 coupled in a cascade connection between the I/O pad IOP and the reference voltage pin VSS. A first terminal T1a of the transistor T1 is coupled to the I/O pad IOP. A second terminal T1b of the transistor T1 is coupled, via the transistor T2, to the reference voltage pin VSS. A gate terminal T1g of the transistor T1 is configured to receive the gate bias signal Vg provided by the bias voltage generator 120. A first terminal T2a of the transistor T2 is coupled to the second terminal T1b of the transistor T1. A second terminal T2b of the transistor T2 is coupled to the reference voltage pin VSS. In the embodiments shown in FIG. 2A and FIG. 2B, the gate terminal T2g of the transistor T2 is coupled to the reference voltage pin VSS. The disclosure is not limited thereto. In some other embodiments, the gate terminal T2g of the transistor T2 can be floating (not connected to any reference voltage pin or any signal input).

As illustrated in FIG. 2B, these transistors T1 and T2 are two-stage snapback transistors stacked in the cascade connection. The transistor T1 is the top one of the snapback transistors stacked in the cascade connection. As shown in FIG. 2B, an N/P junction is formed between the first terminal T1a (N-type) and the P-well PW, and a P/N junction is formed between the P-well PW and the second terminal T2b (N-type) of the transistor T2. Therefore, a parasitic bipolar junction transistor (BJT) will be formed by the transistors T1 and T2. When the ESD event occurs, an ESD current $C_{ESD}$ will flow from the I/O pad IOP through the parasitic BJT to the reference voltage pin VSS, such that the ESD current $C_{ESD}$ will be discharged by the ESD primary circuit 110a without harming the internal circuit INTC shown in FIG. 1. A threshold voltage of the ESD primary circuit 110a is determined by a voltage level that the parasitic BJT is switched on.

In the meantime, based on the structure of the transistors T1 and T2 shown in FIG. 2B, a gate-induced-drain-leakage (GIDL) current $C_{GIDL}$ is flow from the gate terminal T1g through the P-type substrate Psub to a P-well tap PWt. The gate-induced-drain-leakage current $C_{GIDL}$ is competing with a current flow through the channel of the transistor T1. When the gate bias signal Vg is lower (e.g., closer to the ground level), the gate-induced-drain-leakage current $C_{GIDL}$ will be relatively higher. When the gate-induced-drain-leakage current $C_{GIDL}$ is higher, a local substrate bias Vsub will be higher and a base-emitter voltage Vbe of the parasitic BJT will be higher, such that the parasitic BJT will be easier to be turned on and the threshold voltage of the ESD primary circuit 110a will be reduced.

On the other hand, when the gate bias signal Vg is higher, the gate-induced-drain-leakage current $C_{GIDL}$ will be relatively lower. When the gate-induced-drain-leakage current $C_{GIDL}$ is lower, the local substrate bias Vsub will be lower and a base-emitter voltage Vbe of the parasitic BJT will be lower, such that the parasitic BJT will be harder to be turned on and the threshold voltage of the ESD primary circuit 110a will be increased.

Figure 3:
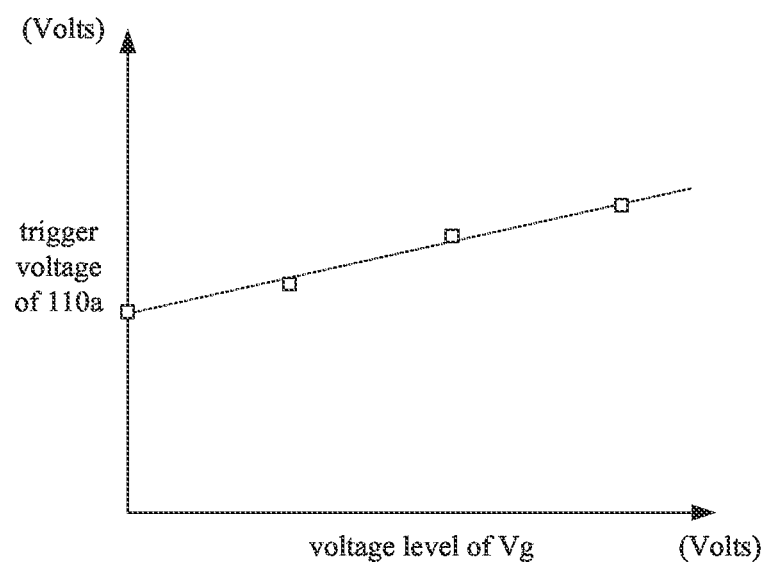
FIG. 3 is a schematic diagram illustrating a relationship between a voltage level of a gate bias signal and a threshold voltage of the ESD primary circuit according to some embodiments.

Reference is further made to FIG. 3. FIG. 3 is a schematic diagram illustrating a relationship between the voltage level of the gate bias signal Vg and the threshold voltage of the ESD primary circuit 110a according to some embodiments. As shown in FIG. 3, the threshold voltage of the ESD primary circuit 110a is lower (i.e., the ESD primary circuit 110a is easier to be switched on) when the voltage level of the gate bias signal Vg is closer to zero, and the threshold voltage of the ESD primary circuit 110a is higher (i.e., the ESD primary circuit 110a is harder to be switched on) when the voltage level of the gate bias signal Vg increases.

In other words, a voltage level of the gate bias signal Vg is positively correlated with the threshold voltage of the ESD primary circuit 110a, and negatively correlated with a sensitivity of the ESD primary circuit 110a.

In other to make sure that the ESD primary circuit 110a activates fast when the ESD occurs, it is desired that the gate bias signal Vg is lower (or closer to the ground level) when the ESD events occurs.

In some embodiments, it is not suitable to fix the gate bias signal Vg at the ground level because of a reliability issue of the transistor T1. For example, the I/O pad IOP can vary between the voltage level (e.g., about 1.8V) on the reference voltage pin VDD1 and the voltage level (e.g., about 0V) on the reference voltage pin VSS. In other words, the voltage level on the I/O pad IOP can reach 1.8V. Each of the transistors T1 and T2 may only allow a smaller voltage difference (e.g., about 1.2V) between drain and gate or source and gate on the transistors T1 or T2. If the I/O pad IOP can reach the 1.8V and the gate bias signal Vg (coupled to the gate terminal of the transistors T1) is always fixed to 0V, the small-sized transistor T1 will operate beyond its tolerance voltage gap (1.8V>1.2V), and will cause the reliability issue on the transistor T1.

In other to make sure that the ESD primary circuit 110a activates fast when the ESD occurs and also avoid the reliability issue on the transistor T1, the bias voltage generator 120 is configured to provide the gate bias signal Vg at a lower voltage level (e.g., a ground level, or close to the ground level) in response to that an ESD event occurs on the I/O pad IOP, and the bias voltage generator 120 provides the gate bias signal Vg at a higher voltage level (e.g., relatively higher than a ground level) in response to that there is no ESD event occurs on the I/O pad IOP. For example, when there is no ESD event occurs on the I/O pad IOP, the bias voltage generator 120 provides the gate bias signal Vg at 1.2V, such that a voltage difference between two terminals of the transistor T1 can be |IOP-Vg|. In some embodiments, since the voltage level on the I/O pad IOP is varied between about 0V to about 1.8V, the |IOP-Vg| can be varied from 10-1.21 to 11.8-1.21, such that the |IOP-Vg| is limited within 1.2V. In other words, the small-sized transistor T1 can be operated within a reliable voltage difference.

In this case, the gate bias signal Vg is provided by the bias voltage generator 120 at the lower voltage level temporarily during the ESD event to reduce the threshold voltage of the ESD primary circuit 110a. The gate bias signal Vg is provided by the bias voltage generator 120 at the higher voltage level under a normal condition (without the ESD event) to increase the reliability of the transistor T1.

The ESD primary circuit 110a in FIG. 2A and FIG. 2B is given for illustrative purposes. Various implements of the ESD primary circuit 110a are within the contemplated scope of the present disclosure. For example, in some embodiments, the ESD primary circuit may include more N-type transistors coupled in cascade connection between the I/O pad IOP and the reference voltage pin VSS.

Figure 2C:
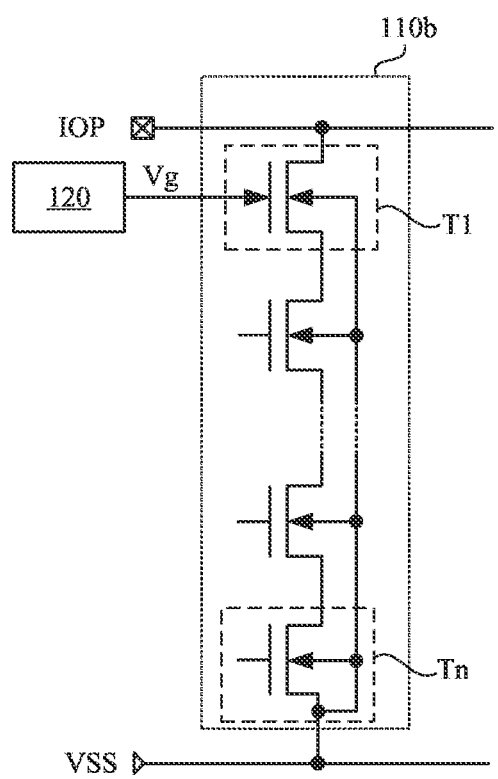
FIG. 2C is a layout diagram illustrating another ESD primary circuit in accordance with various embodiments.

Reference is now made to FIG. 2C. FIG. 2C is a layout diagram illustrating an ESD primary circuit 110b, in accordance with various embodiments. The ESD primary circuit 110b illustrated in FIG. 2A is given for illustrative purposes as another one of embodiments of the ESD primary circuit 110 in FIG. 1. With respect to the embodiments of FIG. 1 and FIG. 2A, like elements in FIG. 2C are designated with the same reference numbers for ease of understanding.

As illustrated in FIG. 2C, the ESD primary circuit 110b include transistors T1~Tn, and n is a positive integer. These transistors T1 to Tn are stacked in the cascade connection to form the n-stage snapback transistors. Similar to aforesaid embodiments shown in FIG. 2A and FIG. 2B, a parasitic BJT will be formed across these transistors T1 to Tn in FIG. 2C, and the threshold voltage of the ESD primary circuit 110b is positively correlated to the voltage level on the gate terminal of the transistor T1.

In other to make sure that the ESD primary circuit 110b activates fast when the ESD occurs and also avoid the reliability issue on the transistor T1, the bias voltage generator 120 is configured to provide the gate bias signal Vg at a lower voltage level in response to that an ESD event occurs on the I/O pad IOP, and the bias voltage generator 120 provides the gate bias signal Vg at a higher voltage level in response to that there is no ESD event occurs on the I/O pad IOP. In this case, the gate bias signal Vg is provided by the bias voltage generator 120 at the lower voltage level temporarily during the ESD event to reduce the threshold voltage of the ESD primary circuit 110b. The gate bias signal Vg is provided by the bias voltage generator 120 at the higher voltage level under a normal condition (without the ESD event) to increase the reliability of the transistor T1.

Figure 2D:
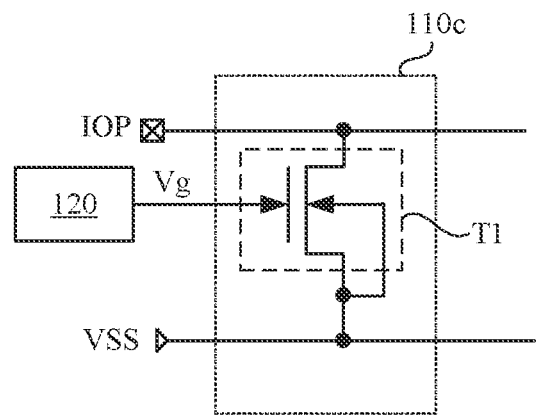
FIG. 2D is a layout diagram illustrating another ESD primary circuit in accordance with various embodiments.
Figure 2E:
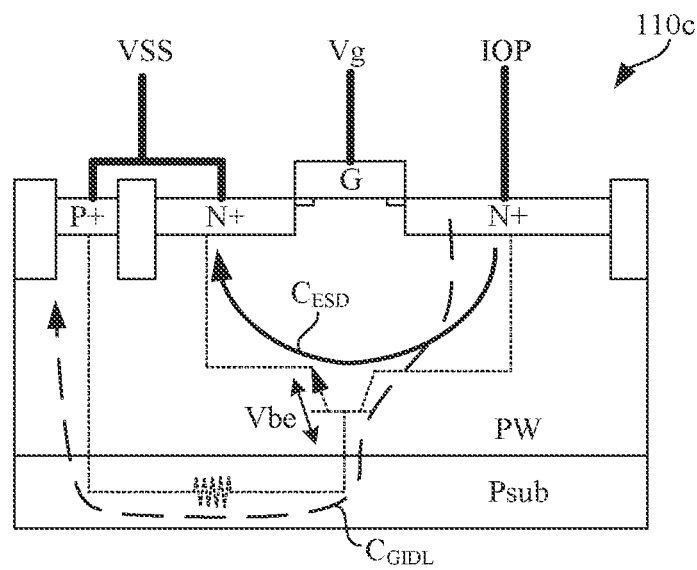
FIG. 2E is a sectional view of the ESD primary circuit in FIG. 2D in accordance with some embodiments.

Reference is now made to FIG. 2D. FIG. 2D is a layout diagram illustrating an ESD primary circuit 110c, in accordance with various embodiments. FIG. 2E is a sectional view of the ESD primary circuit 110c in FIG. 2D, in accordance with some embodiments. The ESD primary circuit 110c illustrated in FIG. 2D and FIG. 2E is given for illustrative purposes as another one of embodiments of the ESD primary circuit 110 in FIG. 1. With respect to the embodiments of FIG. 1, FIG. 2A and FIG. 2B, like elements in FIG. 2D and FIG. 2E are designated with the same reference numbers for ease of understanding.

As illustrated in FIG. 2D and FIG. 2E, the ESD primary circuit 110c include one transistor T1. Similar to aforesaid embodiments shown in FIG. 2A and FIG. 2B, a parasitic BJT will be formed across the transistor T1 in FIG. 2D, and the threshold voltage of the ESD primary circuit 110c is positively correlated to the gate bias signal Vg on the gate terminal of the transistor T1.

Figure 4A:
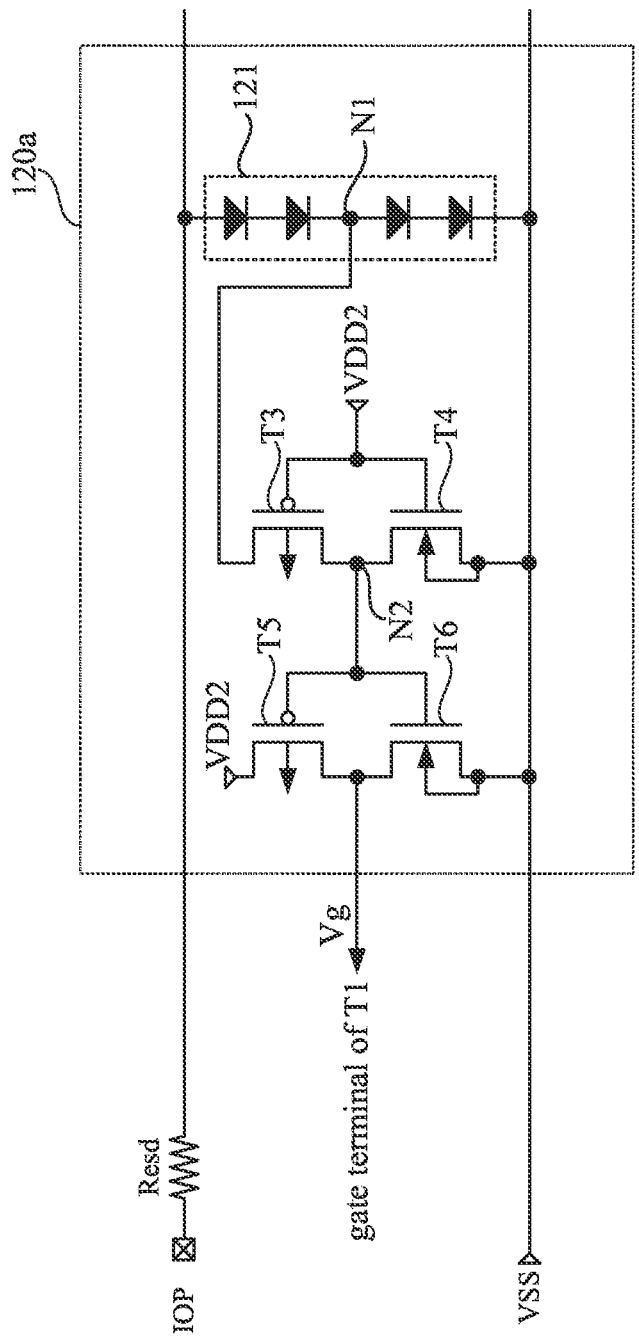
FIG. 4A is a layout diagram illustrating a bias voltage generator in accordance with various embodiments.

Reference is further made to FIG. 4A. FIG. 4A is a layout diagram illustrating a bias voltage generator 120a, in accordance with various embodiments. The bias voltage generator 120a illustrated in FIG. 4A is given for illustrative purposes as one embodiment of the bias voltage generator 120 in FIG. 1. With respect to the embodiments of FIG. 1, like elements in FIG. 4A are designated with the same reference numbers for ease of understanding.

For illustration, as illustrated in FIG. 4A, the bias voltage generator 120a includes a diode string 121, a transistor T3 of P-type, a transistor T4 of N-type, a transistor T5 of P-type and a transistor T6 of N-type. The diode string 121 includes four cascade stacked diodes in the embodiment illustrated in FIG. 4A. These cascade stacked diodes in the diode string 121 are coupled between the I/O pad IOP and the reference voltage pin VSS. The disclosure is not limited to four cascade stacked diodes in the diode string 121. For example, in some embodiments, the number of the diodes included in the diode string 121 can be 2, 3, 4, 5, 6 or more.

As illustrated in FIG. 4A, a first terminal of the P-type transistor T3 is coupled to a node N1 between the two diodes (e.g., the second diode and the third diode) from the cascade stacked diodes in the diode string 121. A second terminal of the transistor T3 is coupled to a node N2. A gate terminal of the transistor T3 is coupled to a reference voltage pin VDD2. In some embodiments, the reference voltage pin VDD2 is a system power supply used in a local power domain, and the reference voltage pin VDD2 is configured at a voltage level lower than the reference voltage pin VDD1 (e.g., the post-driver high voltage VDDPST). For example, the reference voltage pin VDD1 can be configured at about 1.8V and the reference voltage pin VDD2 can be configured at about 1.2V in some embodiments.

As illustrated in FIG. 4A, a first terminal of the N-type transistor T4 is coupled to the node N2. A second terminal of the transistor T4 is coupled to the reference voltage pin VSS. A gate terminal of the transistor T4 is coupled to the reference voltage pin VDD2.

As illustrated in FIG. 4A, a first terminal of the P-type transistor T5 is coupled to the reference voltage pin VDD2. A second terminal of the transistor T5 is coupled to the gate terminal of the transistor T1 (in the ESD primary circuit 110a, 110b, 110c shown in FIG. 2A, 2C or 2D). A gate terminal of the transistor T5 is coupled to the node N2.

As illustrated in FIG. 4A, a first terminal of the N-type transistor T6 is coupled to the gate terminal of the transistor T1 (in the ESD primary circuit 110a, 110b, 110c shown in FIG. 2A, 2C or 2D) and the second terminal of the transistor T5. A second terminal of the transistor T6 is coupled to the reference voltage pin VSS. A gate terminal of the transistor T6 is coupled to the node N2.

When there is no ESD event occurs on the I/O pad IOP, a voltage level on the node N1 is relatively low. The voltage level on the reference voltage pin VDD2 is relatively high, such that the reference voltage pin VDD2 turns off the transistor T3 and turns on the transistor T4. Since the transistor T4 is turned on, the voltage level on the node N2 is low according to the voltage level on the reference voltage pin VSS. Due to the low level on the node N2, the transistor T5 is turned on and the transistor T6 is turned off. The voltage level on the reference voltage pin VDD2 is transmitted to the gate terminal of the transistor T1 (in the ESD primary circuit 110a, 110b, 110c shown in FIG. 2A, 2C or 2D) as the gate bias signal Vg. In other words, when there is no ESD event occurs on the I/O pad IOP, the gate bias signal Vg is configured at VDD2, which can be about 1.2V in some embodiments.

When the ESD event between the I/O pad IOP and the reference voltage pin VSS, the voltage level on the node N1 will be raised by the ESD event on the I/O pad IOP. In this case, the voltage level on the first terminal of the transistor T3 will be much higher than the gate terminal of the transistor T3, such that the transistor T3 is turned on. In this case, the voltage level on the node N2 will be equal to a high voltage level on the node N1. The high voltage level on the node N2 will turn on the transistor T6 and turns off the transistor T5, such that the voltage level on the reference voltage pin VSS is transmitted to the gate terminal of the transistor T1 (in the ESD primary circuit 110a, 110b, 110c shown in FIG. 2A, 2C or 2D) as the gate bias signal Vg. In other words, when the ESD event occurs on the I/O pad IOP, the gate bias signal Vg is configured at VSS, which can be about 0V in some embodiments.

Based on aforesaid embodiments in FIG. 4A, the bias voltage generator 120a provides the gate bias signal Vg at a lower voltage level (equal to VSS) during the ESD event occurring between the I/O pad IOP and the reference voltage pin VSS. The gate bias signal Vg at the lower voltage level will reduce the threshold voltage of the ESD primary circuit 110 shown in FIG. 1.

It is noticed that, in some other embodiments, the ESD event is possible to occur between any two conductive terminals (different from between the I/O pad IOP and the reference voltage pin VSS). For example, as shown in FIG. 1, the ESD event can occur from the I/O pad IOP toward the reference voltage pin VDD1, or from the I/O pad IOP toward the reference voltage pin VDD2. The bias voltage generator 120 in FIG. 1 is not limited to provide the gate bias signal Vg at the lower voltage level when the ESD event occurs from the I/O pad IOP toward the reference voltage pin VSS, as mentioned in aforesaid embodiment of bias voltage generator 120a in FIG. 4A.

Figure 4B:
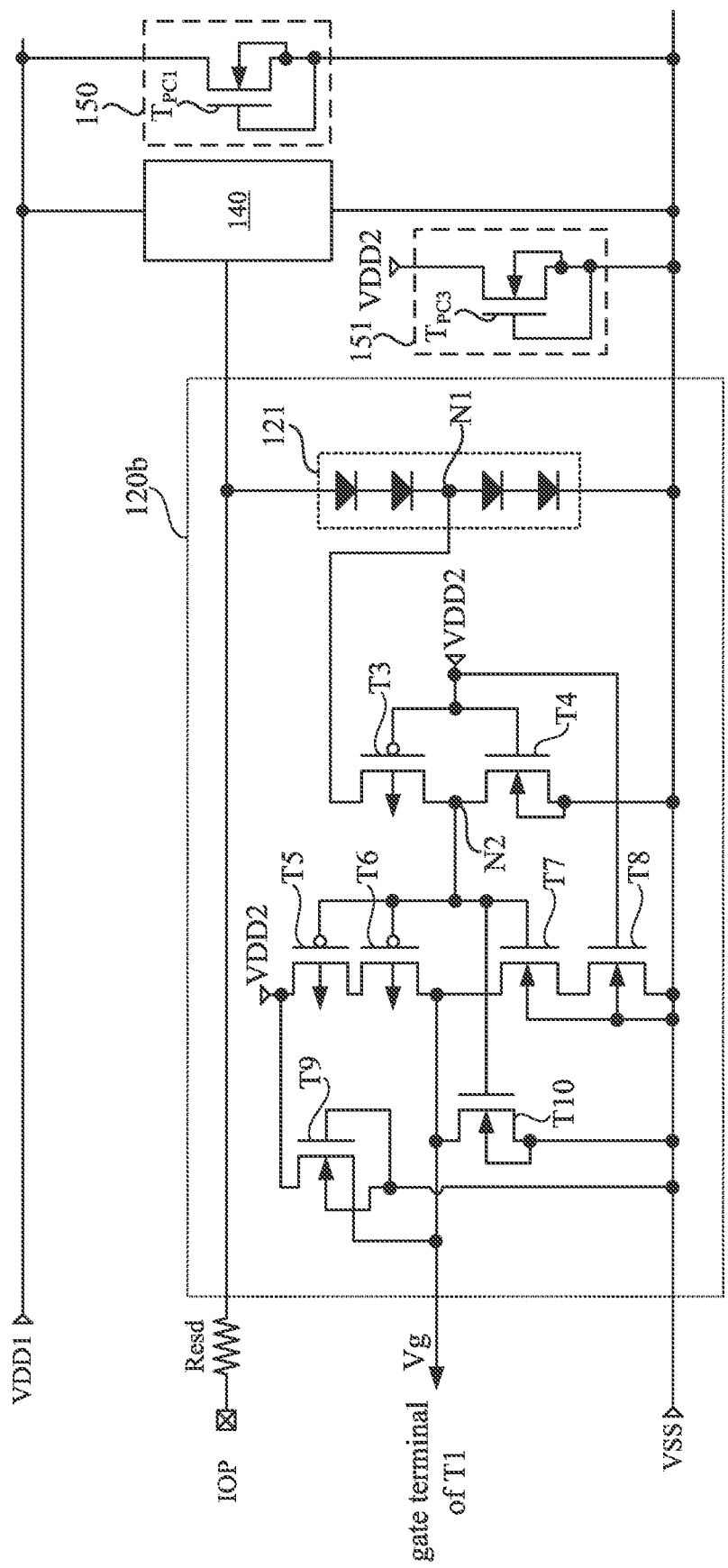
FIG. 4B is a layout diagram illustrating another bias voltage generator in accordance with various embodiments.

Reference is further made to FIG. 4B. FIG. 4B is a layout diagram illustrating another bias voltage generator 120b, in accordance with various embodiments. The bias voltage generator 120b illustrated in FIG. 4B is given for illustrative purposes as another embodiment of the bias voltage generator 120 in FIG. 1. With respect to the embodiments of FIG. 1, like elements in FIG. 4B are designated with the same reference numbers for ease of understanding.

It is noticed that, the bias voltage generator 120b in FIG. 4B is able to provide the gate bias signal Vg at the lower voltage level when the ESD event occurs in at least three following conditions: (1) from the I/O pad IOP toward the reference voltage pin VDD1, (2) from the I/O pad IOP toward the reference voltage pin VDD2, or (3) from the I/O pad IOP toward the reference voltage pin VSS.

For illustration, as illustrated in FIG. 4B, the bias voltage generator 120b includes a diode string 121, a transistor T3 of P-type, a transistor T4 of N-type, a transistor T5 of P-type, a transistor T6 of P-type, a transistor T7 of N-type, a transistor T8 of N-type, a transistor T9 of N-type and a transistor T10 of N-type. The diode string 121 includes four cascade stacked diodes in the embodiment illustrated in FIG. 4B. These cascade stacked diodes in the diode string 121 are coupled between the I/O pad IOP and the reference voltage pin VSS. The disclosure is not limited to four cascade stacked diodes in the diode string 121. For example, in some embodiments, the number of the diodes included in the diode string 121 can be 2, 3, 4, 5, 6 or more.

As illustrated in FIG. 4B, a first terminal of the P-type transistor T3 is coupled to a node N1 between the two diodes (e.g., the second diode and the third diode) from the cascade stacked diodes in the diode string 121. A second terminal of the transistor T3 is coupled to a node N2. A gate terminal of the transistor T3 is coupled to a reference voltage pin VDD2. In some embodiments, the reference voltage pin VDD2 is a system power supply used in a local power domain, and the reference voltage pin VDD2 is configured at a voltage level lower than the reference voltage pin VDD1 (e.g., the post-driver high voltage VDDPST). For example, the reference voltage pin VDD1 can be configured at about 1.8V and the reference voltage pin VDD2 can be configured at about 1.2V in some embodiments.

As illustrated in FIG. 4B, a first terminal of the N-type transistor T4 is coupled to the node N2. A second terminal of the transistor T4 is coupled to the reference voltage pin VSS. A gate terminal of the transistor T4 is coupled to the reference voltage pin VDD2.

As illustrated in FIG. 4B, a first terminal of the P-type transistor T5 is coupled to the reference voltage pin VDD2. A gate terminal of the transistor T6 is coupled to the node N2. A first terminal of the P-type transistor T6 is coupled to the second terminal of the transistor T5. A second terminal of the transistor T6 is coupled to the gate terminal of the transistor T1 (in the ESD primary circuit 110a, 110b, 110c shown in FIG. 2A, 2C or 2D). A gate terminal of the transistor T6 is coupled to the node N2.

As illustrated in FIG. 4B, a first terminal of the N-type transistor T7 is coupled to the gate terminal of the transistor T1 (in the ESD primary circuit 110a, 110b, 110c shown in FIG. 2A, 2C or 2D). A gate terminal of the transistor T7 is coupled to the node N2. A first terminal of the transistor T8 is coupled to a second terminal of the transistor T7. A second terminal of the transistor T8 is coupled to the reference voltage pin VSS. A gate terminal of the transistor T8 is coupled to the reference voltage pin VDD2.

As illustrated in FIG. 4B, a first terminal of the N-type transistor T9 is coupled to the reference voltage pin VDD2.

A second terminal of the transistor T9 is coupled to the gate terminal of the transistor T1 (in the ESD primary circuit 110a, 110b, 110c shown in FIG. 2A, 2C or 2D). A gate terminal of the transistor T9 is coupled to the reference voltage pin VSS.

As illustrated in FIG. 4B, a first terminal of the N-type transistor T10 is coupled to the gate terminal of the first transistor T1 (in the ESD primary circuit 110a, 110b, 110c shown in FIG. 2A, 2C or 2D), a second terminal of the tenth transistor T10 is coupled to the reference voltage pin VSS. A gate terminal of the transistor T10 is coupled to the node N2.

When the ESD event occurs from the I/O pad IOP toward the reference voltage pin VDD1 (e.g., IOP at the high level and VDD1 at the ground level), the ESD current induced by the ESD event will flow from the I/O pad IOP through the diode string 121, through the reference voltage pin VSS, through a transistor $T_{PC1}$ in the power clamp 150 to the reference voltage pin VDD1. Due to a voltage difference on body diode in the transistor $T_{PC1}$ of the power clamp 150, the voltage level of the reference voltage pin VSS will be raised slightly above than the ground level (on the reference voltage pin VDD1) during the ESD event from the I/O pad IOP toward the reference voltage pin VDD1. In other words, the voltage level of the reference voltage pin VSS will be above the ground level (VSS>0) during this ESD event. During the ESD event, the voltage level on the node N1 will be raised by the ESD event on the I/O pad IOP. In this case, the voltage level on the first terminal of the transistor T3 will be much higher than the gate terminal of the transistor T3 (N1>VDD1), such that the transistor T3 is turned on. In this case, the voltage level on the node N2 will be equal to a high voltage level on the node N1. The high voltage level on the node N2 will turn on the transistor T7 and turns off the transistors T5 and T6. In the meantime, the reference voltage pin VDD2 turns on the transistor T8. The voltage level on the reference voltage pin VDD1 (during the ESD event, VDD1 is at the ground level) is transmitted, through the transistors T7 and T8, to the gate terminal of the transistor T1. In other words, when the ESD event occurs from the I/O pad IOP toward the reference voltage pin VDD1, the gate bias signal Vg is configured at VDD1, which is about 0V in some embodiments.

In some embodiments, the reference voltage pin VDD2 is a power supply voltage from a power domain different from the reference voltage pin VDD1. For example, the reference voltage pin VDD2 is from the power domain utilized inside the internal circuit INTC. As illustrated in FIG. 4B, in order to discharge a ESD current occurs on the reference voltage pin VDD2, another power clamp 151 can be implemented between the reference voltage pin VDD2 and the reference voltage pin VSS. When the ESD event occurs from the I/O pad IOP toward the reference voltage pin VDD2 (e.g., IOP at the high level and VDD2 at the ground level), the ESD current induced by the ESD event will flow from the I/O pad IOP through the diode string 121, through the reference voltage pin VSS, through a transistor $T_{PC3}$ in the power clamp 151, and then to the reference voltage pin VDD2. Due to a voltage difference on body diode in the transistor $T_{PC3}$ of the power clamp 151, the voltage level of the reference voltage pin VSS will be raised slightly above than the ground level during the ESD event from the I/O pad IOP toward the reference voltage pin VDD2. In other words, the voltage level of the reference voltage pin VSS will be above the ground level (VSS>0) during this ESD event. During the ESD event, because the reference voltage pin VSS will be above the ground level, the transistor T9 is turned on, such that the reference voltage pin VDD2 is transmitted to the gate terminal of the transistor T1 (in the ESD primary circuit 110a, 110b, 110c shown in FIG. 2A, 2C or 2D) as the gate bias signal Vg. During this ESD event occurs from the I/O pad IOP toward the reference voltage pin VDD2, the voltage level on the reference voltage pin VDD2 is the ground level. Therefore, the gate bias signal Vg is configured at the ground level during this ESD event. In other words, when the ESD event occurs from the I/O pad IOP toward the reference voltage pin VDD2, the gate bias signal Vg is configured at VDD2, which is about 0V during the ESD event in some embodiments.

When the ESD event from the I/O pad IOP and the reference voltage pin VSS (e.g., IOP at the high level and VSS at the ground level), the voltage level on the node N1 will be raised by the ESD event on the I/O pad IOP. In this case, the voltage level on the first terminal of the transistor T3 will be much higher than the gate terminal of the transistor T3, such that the transistor T3 is turned on. In this case, the voltage level on the node N2 will be equal to a high voltage level on the node N1. The high voltage level on the node N2 will turn on the transistor T10, such that the reference voltage pin VSS is transmitted through the transistor T10 to the gate terminal of the transistor T1 (in the ESD primary circuit 110a, 110b, 110c shown in FIG. 2A, 2C or 2D) as the gate bias signal Vg. In other words, when the ESD event occurs from the I/O pad IOP toward the reference voltage pin VSS, the gate bias signal Vg is configured at VSS, which is about 0V during the ESD event in some embodiments.

When there is no ESD event, the transistor T4 is turned on by the reference voltage pin VDD2, and the voltage level on the node N2 is equal to the reference voltage pin VSS. In this case, the transistors T5 and T6 are turned on, such that the reference voltage pin VDD2 is transmitted through the transistors T5 and T6 to the gate terminal of the transistor T1 (in the ESD primary circuit 110a, 110b, 110c shown in FIG. 2A, 2C or 2D) as the gate bias signal Vg. In other words, when there no ESD event, the gate bias signal Vg is configured at VDD2, which is about 1.2V in some embodiments.

Based on aforesaid embodiments, different types of ESD events can be detected by the bias voltage generator 120b, and the bias voltage generator 120b is able to provide the gate bias signal Vg at the lower voltage level in response to different types of ESD events.

In aforesaid embodiments shown in FIG. 4A and FIG. 4B, each of the bias voltage generator 120a and the bias voltage generator 120b includes the diode string 121 coupled between the I/O pad IOP and the reference voltage pin VSS. The disclosure is not limited thereto. In some other embodiments, the bias voltage generator can utilize a diode string in the ESD secondary circuit.

Figure 5:
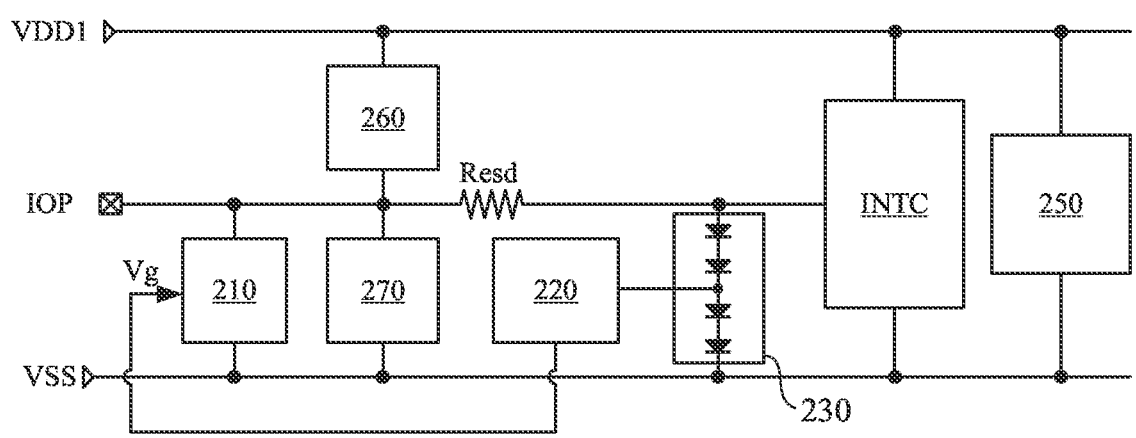
FIG. 5 is a block diagram illustrating an integrated circuit in accordance with various embodiments.

Reference is further made to FIG. 5, which is a block diagram illustrating an integrated circuit 200, in accordance with various embodiments. For illustration, the integrated circuit 200 includes an input/output (I/O) pad IOP, an electrostatic discharge (ESD) primary circuit 210, a bias voltage generator 220, an ESD secondary circuit 230, a power clamp 250, a pull-up driver 260 and a pull-down driver 270. The details of the ESD primary circuit 210, the power clamp 250, the pull-up driver 260 and the pull-down driver 270 in embodiments of FIG. 5 are similar to the ESD primary circuit 110, the power clamp 150, the pull-up driver 160 and the pull-down driver 170 in aforesaid embodiments in FIG. 1 to FIG. 4B, and not repeated again.

It is noticed that the ESD secondary circuit 230 includes a diode string. When the ESD event occurs between the I/O pad IOP and the reference voltage pin VSS, the diode string in the ESD secondary circuit 230 will help to discharge an ESD current from the I/O pad IOP to the reference voltage pin VSS.

Figure 6:
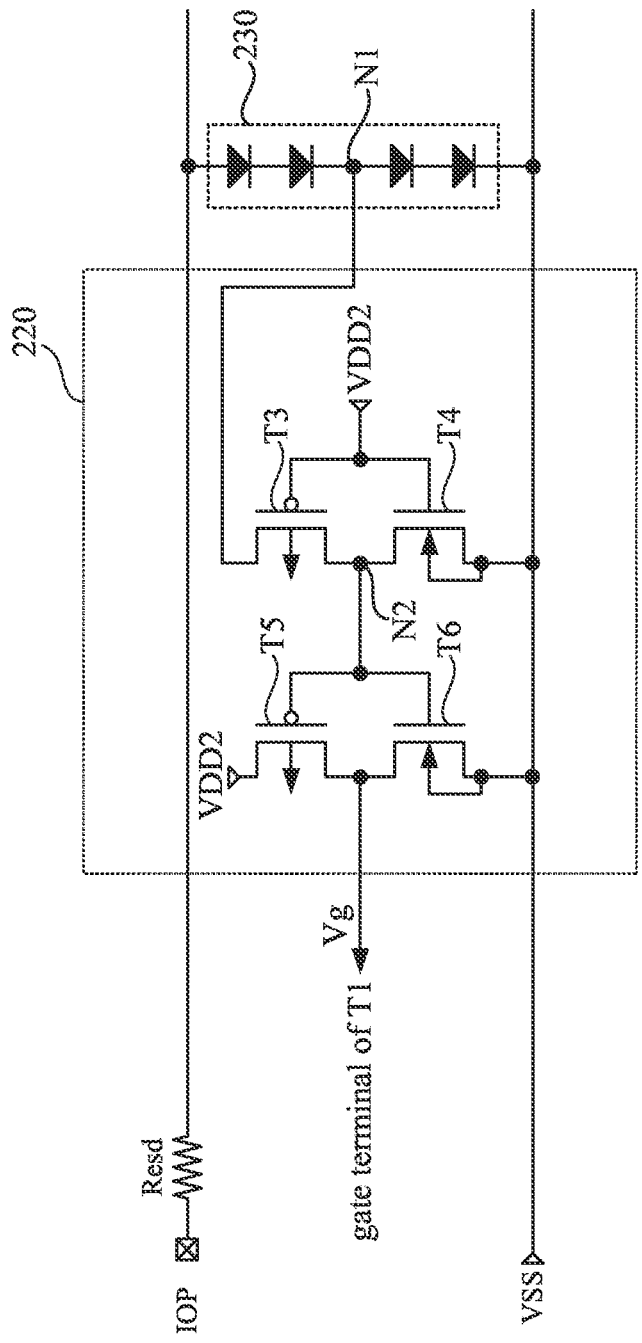
FIG. 6 is a layout diagram illustrating a bias voltage generator in FIG. 5 in accordance with various embodiments.

Reference is further made to FIG. 6. FIG. 6 is a layout diagram illustrating a bias voltage generator 220 in FIG. 5, in accordance with various embodiments. The bias voltage generator 220 illustrated in FIG. 6 is given for illustrative purposes as one embodiment of the bias voltage generator 220 in FIG. 5. With respect to the embodiments of FIG. 5, like elements in FIG. 6 are designated with the same reference numbers for ease of understanding.

For illustration, as illustrated in FIG. 6, the bias voltage generator 220 includes a transistor T3 of P-type, a transistor T4 of N-type, a transistor T5 of P-type and a transistor T6 of N-type.

As illustrated in FIG. 4A, a first terminal of the P-type transistor T3 is coupled to a node N1 between the two diodes (e.g., the second diode and the third diode) from the cascade stacked diodes in the ESD secondary circuit 230. A second terminal of the transistor T3 is coupled to a node N2. A gate terminal of the transistor T3 is coupled to a reference voltage pin VDD2. Other structures of the transistors T4-T6 in the bias voltage generator 220 in FIG. 6 are similar to the embodiments shown in FIG. 4A.

Similarly, a structure similar to the bias voltage generator 120b in FIG. 4B (without including the diode string 121 in the bias voltage generator 120b) can also be utilized in the bias voltage generator 220 in FIG. 5.

In this case, the bias voltage generator 220 in FIG. 5 and FIG. 6 is not require to include the diode string, and the bias voltage generator 220 can utilized the diode string in the ESD secondary circuit 230 to detect the ESD event on the I/O pad IOP.

Figure 7:
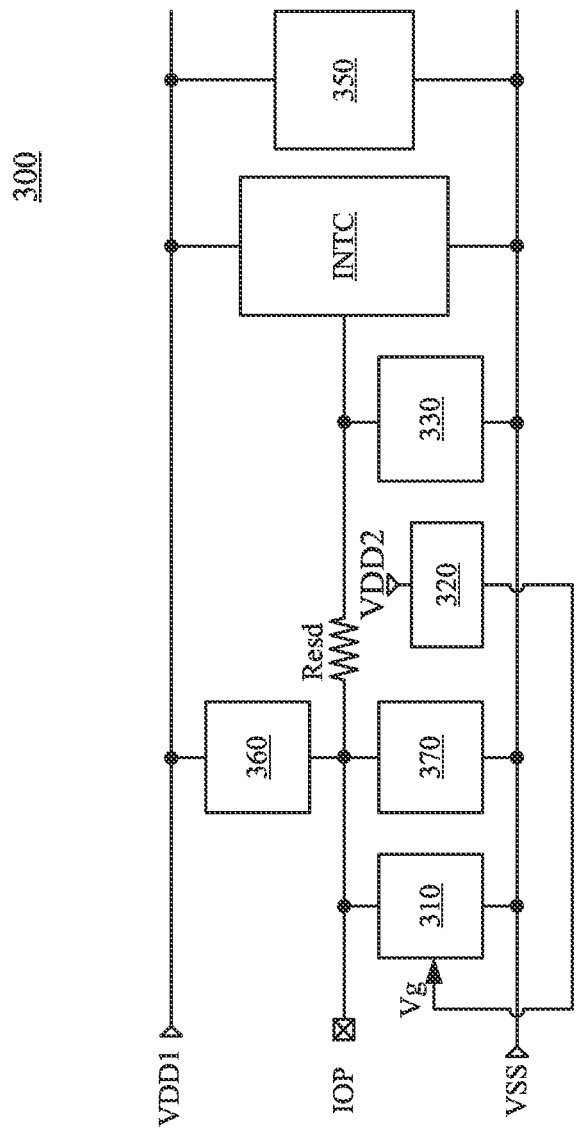
FIG. 7 is a block diagram illustrating an integrated circuit in accordance with various embodiments.

Reference is further made to FIG. 7, which is a block diagram illustrating an integrated circuit 300, in accordance with various embodiments. For illustration, the integrated circuit 300 includes an input/output (I/O) pad IOP, an electrostatic discharge (ESD) primary circuit 310, a bias voltage generator 320, an ESD secondary circuit 330, a power clamp 350, a pull-up driver 360 and a pull-down driver 370. The details of the ESD primary circuit 310, the ESD secondary circuit 330, the power clamp 350, the pull-up driver 360 and the pull-down driver 370 in embodiments of FIG. 7 are similar to the ESD primary circuit 110, the ESD primary circuit 130, the power clamp 150, the pull-up driver 160 and the pull-down driver 170 in aforesaid embodiments in FIG. 1 to FIG. 4B, and not repeated again.

For illustration, as illustrated in FIG. 7, the bias voltage generator 320 is coupled to the reference voltage pin VDD2, and configured to provide the gate bias signal Vg to the ESD primary circuit 310.

Figure 8:
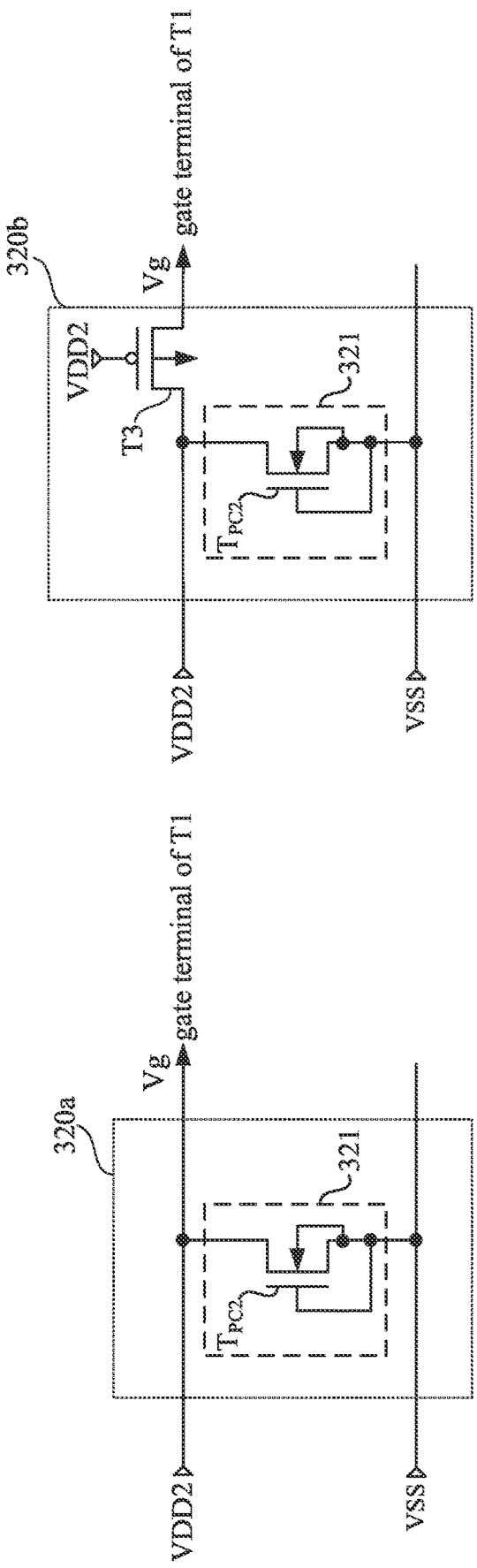
FIG. 8A is a layout diagram illustrating a bias voltage generator in accordance with various embodiments.
FIG. 8B is a layout diagram illustrating another bias voltage generator in accordance with various embodiments.

Reference is further made to FIG. 8A. FIG. 8A is a layout diagram illustrating a bias voltage generator 320a, in accordance with various embodiments. The bias voltage generator 320a illustrated in FIG. 8A is given for illustrative purposes as one embodiment of the bias voltage generator 320 in FIG. 7. For illustration, as illustrated in FIG. 8A, the bias voltage generator 320a includes a power clamp 321. The power clamp 321 is coupled between the reference voltage pin VDD2 and the reference voltage pin VSS. A threshold voltage of the power clamp 321 is higher than a voltage level of the reference voltage pin VDD2 without any ESD event occurring on the I/O pad IOP.

For illustration, as illustrated in FIG. 8A, the power clamp 321 includes a transistor $T_{PC2}$. A first terminal of the transistor $T_{PC2}$ is coupled to the reference voltage pin VDD2. The reference voltage pin VDD2 is coupled to the gate terminal of the transistor T1 in the ESD primary circuit 310 (can be referred to the transistor T1 in the ESD primary circuit 110a, 110b, 110c shown in FIG. 2A, 2C or 2D).

When there is no ESD event, the voltage level (e.g., at about 1.2V) of the reference voltage pin VDD2 is transmitted as the gate bias signal Vg to the transistor T1 in the ESD primary circuit 310.

When an ESD event occurs to the reference voltage pin VDD2, the voltage level (e.g., at about 1.2V) of the reference voltage pin VDD2 exceeds the threshold voltage of the power clamp 321, and the power clamp 321 is turned on, such that the reference voltage pin VDD2 is connected to the reference voltage pin VSS. In this case, the voltage level of the gate bias signal Vg is pulled down to the voltage level on the reference voltage pin VSS. During the ESD event, the gate bias signal Vg provided by the bias voltage generator 320a is configured at the lower level (Vg is about 0V).

Reference is further made to FIG. 8B. FIG. 8B is a layout diagram illustrating a bias voltage generator 320b, in accordance with various embodiments. The bias voltage generator 320b illustrated in FIG. 8B is given for illustrative purposes as one embodiment of the bias voltage generator 320 in FIG. 7. For illustration, as illustrated in FIG. 8B, the bias voltage generator 320b includes a power clamp 321 and a transistor T3. The power clamp 321 is coupled between the reference voltage pin VDD2 and the reference voltage pin VSS. A first terminal of the transistor T3 is coupled to the reference voltage pin VDD2. A second terminal of the transistor T3 is coupled to the gate terminal of the transistor T1 in the ESD primary circuit 310 (can be referred to the transistor T1 in the ESD primary circuit 110a, 110b, 110c shown in FIG. 2A, 2C or 2D). A gate terminal of the transistor T3 is coupled to the reference voltage pin VDD2.

When an ESD event occurs, the voltage level (e.g., at about 1.2V) of the reference voltage pin VDD2 exceeds the threshold voltage of the power clamp 321, and the power clamp 321 is turned on, such that the reference voltage pin VDD2 is connected to the reference voltage pin VSS. In this case, the voltage level of the reference voltage pin VDD2 is pulled down to the voltage level on the reference voltage pin VSS. Therefore, the transistor T3 is turned on after the reference voltage pin VDD2 is pulled down, and transmits the voltage level on the reference voltage pin VSS to the transistor T1 in the ESD primary circuit 310. The voltage level of Vg provided by the bias voltage generator 320b is configured at the lower level (Vg is about 0V).

Figure 9:
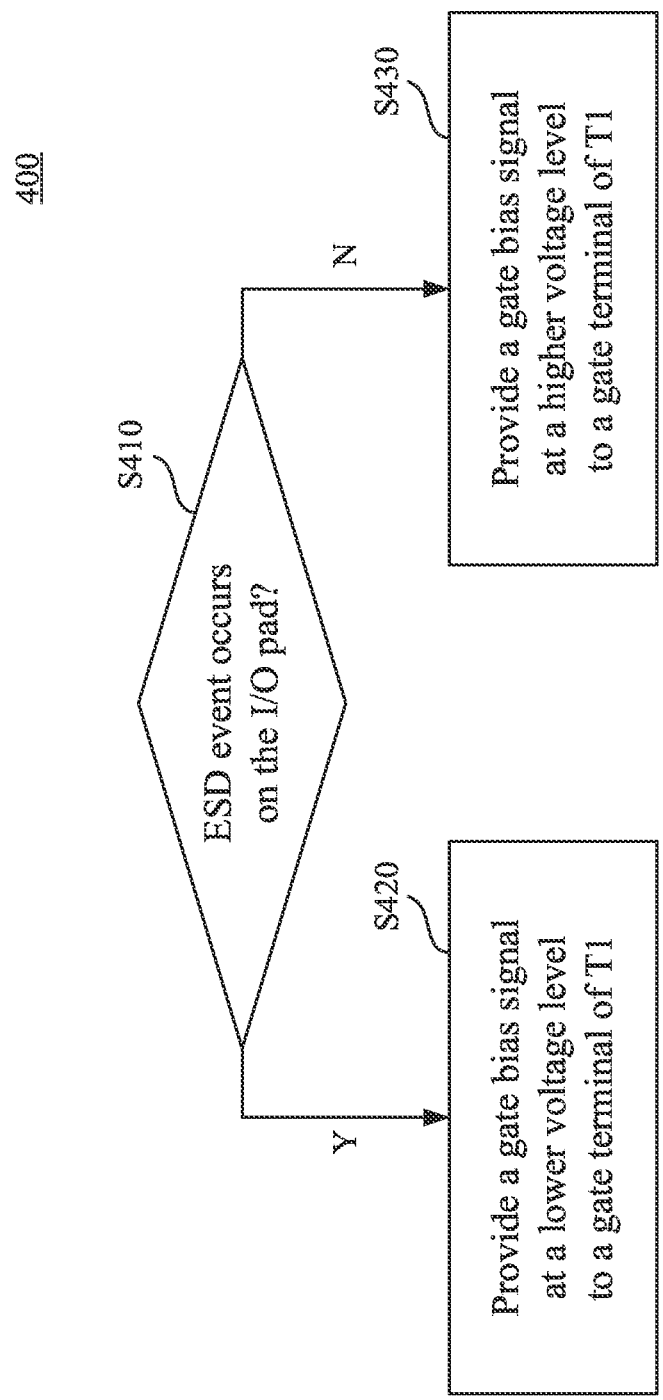
FIG. 9 is a flow chart diagram illustrating a method in accordance with various embodiments.

Reference is further made to FIG. 9. FIG. 9 is a flow chart diagram illustrating a method 400, in accordance with various embodiments. The method 400 in FIG. 9 can be performed by the integrated circuit 100, 200 or 300 as mentioned in FIG. 1 to FIG. 7. For illustration, as illustrated in FIG. 9, operation S410 is performed to detect whether an ESD event occurs on the I/O pad.

When the ESD event occurs on the I/O pad, operation S420 is performed to provide a gate bias signal at a lower voltage level to a gate terminal of a transistor (can be referred to the transistor T1 in the ESD primary circuit 110a, 110b, 110c shown in FIG. 2A, 2C or 2D) in an ESD primary circuit by the bias voltage generator 120a, 120b, 220, 320a or 320b shown in FIG. 2A, FIG. 2B, FIG. 6, FIG. 8A or FIG. 8B as discussed in aforesaid embodiments.

When there is no ESD event on the I/O pad, operation S430 is performed to provide the gate bias signal at a higher voltage level to a gate terminal of a transistor (can be referred to the transistor T1 in the ESD primary circuit 110a, 110b, 110c shown in FIG. 2A, 2C or 2D) in an ESD primary circuit by the bias voltage generator 120a, 120b, 220, 320a or 320b shown in FIG. 2A, FIG. 2B, FIG. 6, FIG. 8A or FIG. 8B as discussed in aforesaid embodiments.

As shown in FIG. 1, FIG. 5 and FIG. 7, the ESD primary circuit 110, 210 or 310 is coupled between the I/O pad IOP and the reference voltage pin VSS. In response to that the ESD event occurs on the I/O pad, a voltage level on the I/O pad IOP exceeds a threshold voltage of the ESD primary circuit 110, 210 or 310, and the ESD primary circuit 110, 210 or 310 is activated to guide an ESD current from the I/O pad IOP through the ESD primary circuit 110, 210 or 310 to the reference voltage pin VSS.

A threshold voltage of the ESD primary circuit 110, 210 or 310 is positively correlated to a voltage level on the gate terminal of a transistor (can be referred to the transistor T1 in the ESD primary circuit 110a, 110b, 110c shown in FIG. 2A, 2C or 2D) in the ESD primary circuit 110, 210 or 310.

In some embodiments, the I/O signal on the I/O pad IOP switches within a first voltage range (e.g., between about 0V and about 1.8V), and a voltage level of the gate terminal of the first transistor switches within a second voltage range (e.g., between about 0V and about 1.2V). The first voltage range is wider than the second voltage range. The second voltage range (e.g., between about 0V and about 1.2V) is related to a reliable voltage range of the transistor T1 in the ESD primary circuit 110a, 110b, 110c shown in FIG. 2A, 2C or 2D. In some cases, in order to shrink the size of the ESD primary circuit 110a as shown in FIG. 2A, the transistor T1 may only allow a smaller voltage difference (e.g., about 1.2V) between any two terminals on the transistor T1. If the I/O pad IOP can reach the 1.8V and the gate bias signal Vg (coupled to the gate terminal of the transistors T1) is always fixed to 0V, the small-sized transistor T1 will operate beyond its tolerance voltage gap (1.8V>1.2V), and will cause the reliability issue on the transistor T1.

As shown in FIG. 2A and FIG. 9, in other to make sure that the ESD primary circuit 110a activates fast when the ESD occurs and also avoid the reliability issue on the transistor T1, the bias voltage generator 120 is configured to provide the gate bias signal Vg at a lower voltage level (e.g., a ground level, or close to the ground level) in response to that an ESD event occurs on the I/O pad IOP in the operation S420. On the other hand, the bias voltage generator 120 provides the gate bias signal Vg at a higher voltage level (e.g., relatively higher than a ground level) in response to that there is no ESD event occurs on the I/O pad IOP in the operation S430.

Figure 10:
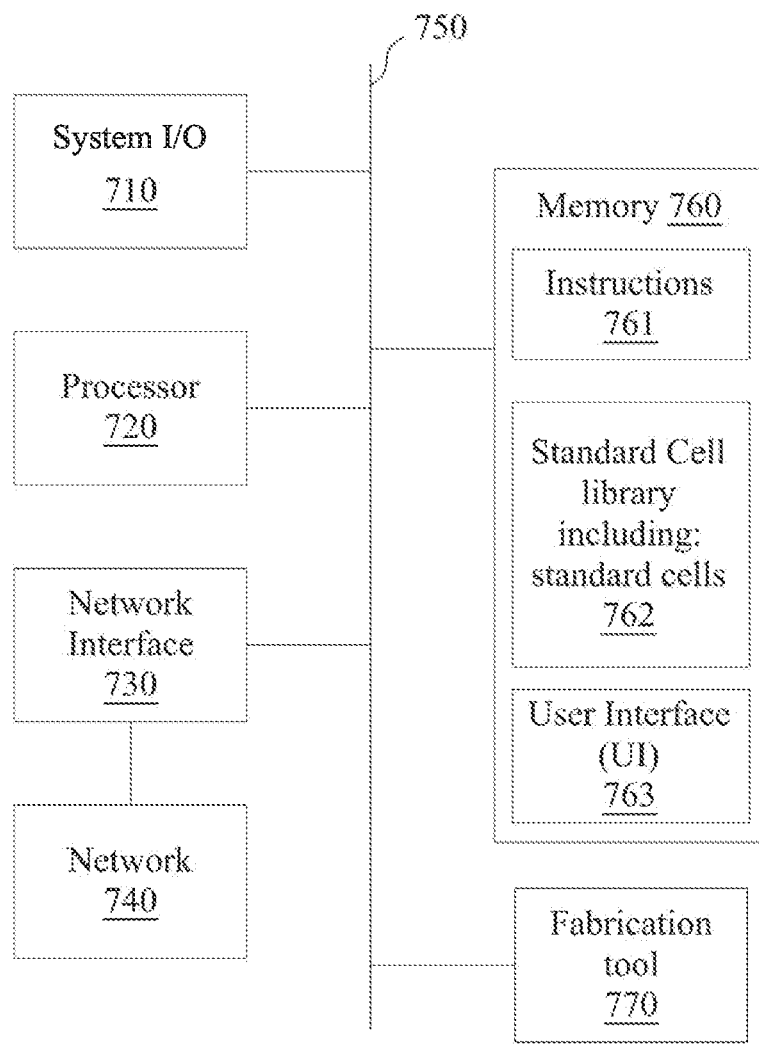
FIG. 10 is a block diagram of a system for designing the integrated circuit layout design, in accordance with some embodiments of the present disclosure.

Reference is now made to FIG. 10. FIG. 10 is a block diagram of an electronic design automation (EDA) system 700 for designing the integrated circuit layout design, in accordance with some embodiments of the present disclosure. EDA system 700 is configured to design and/or manufacture the integrated circuit 100, 200 or 300 disclosed in FIG. 1, FIG. 5 or FIG. 7, and further explained in conjunction with FIGS. 2A-8B. In some embodiments, EDA system 700 includes an APR system.

In some embodiments, EDA system 700 is a general purpose computing device including a hardware processor 720 and a non-transitory, computer-readable storage medium 760. Storage medium 760, amongst other things, is encoded with, i.e., stores, computer program code (instructions) 761, i.e., a set of executable instructions. Execution of instructions 761 by hardware processor 720 represents (at least in part) an EDA tool which implements a portion or all of e.g., the method 400.

The processor 720 is electrically coupled to computer-readable storage medium 760 via a bus 750. The processor 720 is also electrically coupled to a system I/O 710 and a fabrication tool 770 by bus 750. A network interface 730 is also electrically connected to processor 720 via bus 750. Network interface 730 is connected to a network 740, so that processor 720 and computer-readable storage medium 760 are capable of connecting to external elements via network 740. The processor 720 is configured to execute computer program code 761 encoded in computer-readable storage medium 760 in order to cause EDA system 700 to be usable for performing a portion or all of the noted processes and/or methods. In one or more embodiments, processor 720 is a central processing unit (CPU), a multi-processor, a distributed processing system, an application specific integrated circuit (ASIC), and/or a suitable processing unit.

In one or more embodiments, computer-readable storage medium 760 is an electronic, magnetic, optical, electromagnetic, infrared, and/or a semiconductor system (or apparatus or device). For example, computer-readable storage medium 760 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 760 includes a compact disk-read only memory (CD-ROM), a compact disk-read/write (CD-R/W), and/or a digital video disc (DVD).

In one or more embodiments, storage medium 760 stores computer program code 761 configured to cause EDA system 700 (where such execution represents (at least in part) the EDA tool) to be usable for performing a portion or all of the noted processes and/or methods. In one or more embodiments, storage medium 760 also stores information which facilitates performing a portion or all of the noted processes and/or methods. In one or more embodiments, storage medium 760 stores library 762 of standard cells including such standard cells as disclosed herein, for example, a cell including transistors 220-240 discussed above with respect to FIG. 2A.

EDA system 700 includes a system I/O 710. The system I/O 710 is an interface coupled to external circuitry. In one or more embodiments, the system I/O 710 includes a keyboard, keypad, mouse, trackball, trackpad, touchscreen, and/or cursor direction keys for communicating information and commands to processor 720.

EDA system 700 also includes network interface 730 coupled to processor 720. Network interface 730 allows EDA system 700 to communicate with network 740, to which one or more other computer systems are connected. Network interface 730 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 700.

EDA system 700 also includes the fabrication tool 770 coupled to processor 720. The fabrication tool 770 is configured to fabricate integrated circuits, e.g., the integrated circuit 100 illustrated in FIG. 1, according to the design files processed by the processor 720.

EDA system 700 is configured to receive information through the system I/O 710. The information received through the system I/O 710 includes one or more of instructions, data, design rules, libraries of standard cells, and/or other parameters for processing by processor 720. The information is transferred to processor 720 via bus 750. EDA system 700 is configured to receive information related to a UI through the system I/O 710. The information is stored in computer-readable medium 760 as user interface (UI) 763.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 700. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, for example, one or more of an optical disk, such as a DVD, a magnetic disk, such as a hard disk, a semiconductor memory, such as a ROM, a RAM, a memory card, and the like.

Figure 11:
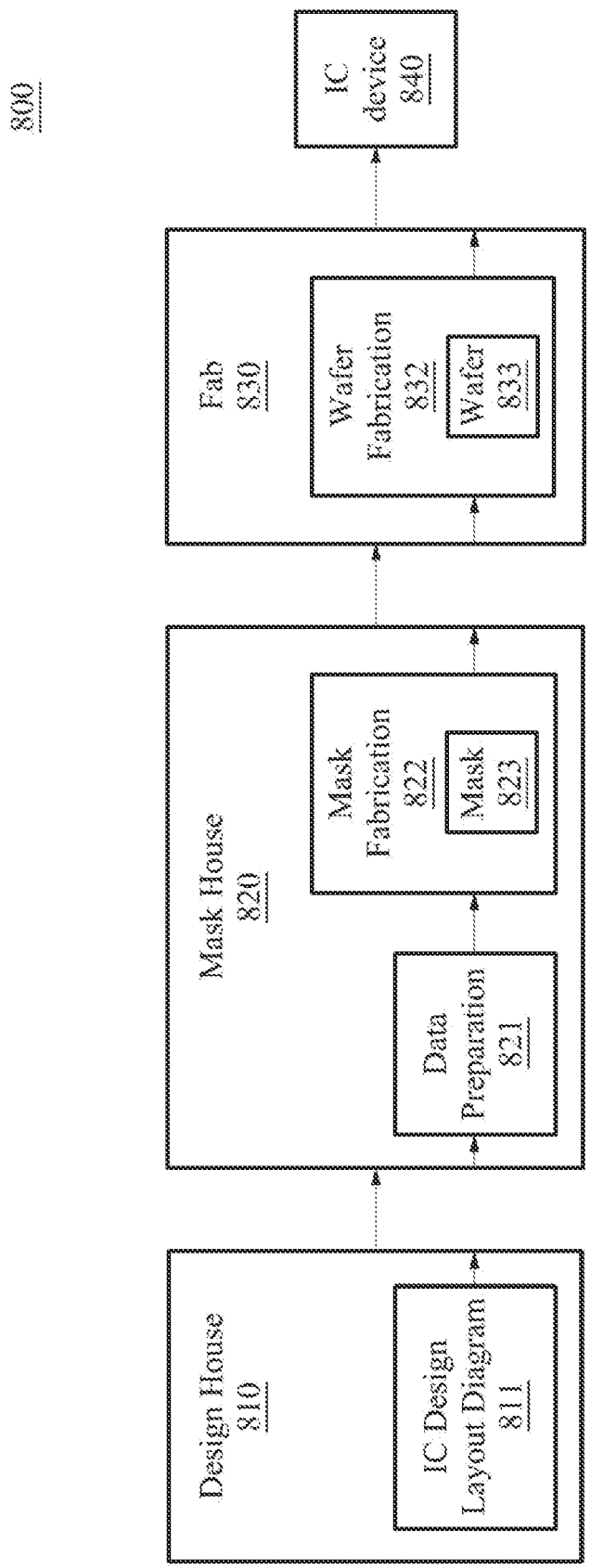
FIG. 11 is a block diagram of an integrated circuit manufacturing system, and an integrated circuit manufacturing flow associated therewith, in accordance with some embodiments.

FIG. 11 is a block diagram of IC manufacturing system 800, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using IC manufacturing system 800.

In FIG. 11, IC manufacturing system 800 includes entities, such as a design house 810, a mask house 820, and an IC manufacturer/fabricator ("fab") 830, that interact with one another in the design, development, and manufacturing cycles and/or services related to manufacturing an IC device 840. The entities in IC manufacturing system 800 are connected by a communications network. In some embodiments, the communications network is a single network. In some embodiments, the communications network is a variety of different networks, such as an intranet and the Internet. The communications network includes wired and/or or wireless communication channels. Each entity interacts with one or more of the other entities and provides services to and/or receives services from one or more of the other entities. In some embodiments, two or more of design house 810, mask house 820, and IC fab 830 is owned by a single larger company. In some embodiments, two or more of design house 810, mask house 820, and IC fab 830 coexist in a common facility and use common resources.

Design house (or design team) 810 generates an IC design layout diagram 811. IC design layout diagram 811 includes various geometrical patterns, for example, an IC layout design depicted in FIG. 1, FIG. 5 and FIG. 7, and further explained in conjunction with FIGS. 2A-8B, designed for an IC device 840, for example, integrated circuits 100, 200 and 300, discussed above with respect to FIG. 1, FIG. 5 and FIG. 7. The geometrical patterns correspond to patterns of metal, oxide, or semiconductor layers that make up the various components of IC device 840 to be fabricated. The various layers combine to form various IC features. For example, a portion of IC design layout diagram 811 includes various IC features, such as an active region, gate electrode, source and drain, conductive segments or vias of an interlayer interconnection, to be formed in a semiconductor substrate (such as a silicon wafer) and various material layers disposed on the semiconductor substrate. Design house 810 implements a proper design procedure to form IC design layout diagram 811. The design procedure includes one or more of logic design, physical design or place and route. IC design layout diagram 811 is presented in one or more data files having information of the geometrical patterns. For example, IC design layout diagram 811 can be expressed in a GDSII file format or DFII file format.

Mask house 820 includes data preparation 821 and mask fabrication 822. Mask house 820 uses IC design layout diagram 811 to manufacture one or more masks 823 to be used for fabricating the various layers of IC device 840 according to IC design layout diagram 811. Mask house 820 performs mask data preparation 821, where IC design layout diagram 811 is translated into a representative data file ("RDF"). Mask data preparation 821 provides the RDF to mask fabrication 822. Mask fabrication 822 includes a mask writer. A mask writer converts the RDF to an image on a substrate, such as a mask (reticle) 823 or a semiconductor wafer 833. The IC design layout diagram 811 is manipulated by mask data preparation 821 to comply with particular characteristics of the mask writer and/or requirements of IC fab 830. In FIG. 11, data preparation 821 and mask fabrication 822 are illustrated as separate elements. In some embodiments, data preparation 821 and mask fabrication 822 can be collectively referred to as mask data preparation.

In some embodiments, data preparation 821 includes optical proximity correction (OPC) which uses lithography enhancement techniques to compensate for image errors, such as those that can arise from diffraction, interference, other process effects and the like. OPC adjusts IC design layout diagram 811. In some embodiments, data preparation 821 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, data preparation 821 includes a mask rule checker (MRC) that checks the IC design layout diagram 811 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 811 to compensate for limitations during mask fabrication 822, which may undo part of the modifications performed by OPC in order to meet mask creation rules.

In some embodiments, data preparation 821 includes lithography process checking (LPC) that simulates processing that will be implemented by IC fab 830 to fabricate IC device 840. LPC simulates this processing based on IC design layout diagram 811 to create a simulated manufactured device, such as IC device 840. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 811.

It should be understood that the above description of data preparation 821 has been simplified for the purposes of clarity. In some embodiments, data preparation 821 includes additional features such as a logic operation (LOP) to modify the IC design layout diagram 811 according to manufacturing rules. Additionally, the processes applied to IC design layout diagram 811 during data preparation 821 may be executed in a variety of different orders.

After data preparation 821 and during mask fabrication 822, a mask 823 or a group of masks 823 are fabricated based on the modified IC design layout diagram 811. In some embodiments, mask fabrication 822 includes performing one or more lithographic exposures based on IC design layout diagram 811. In some embodiments, an electron-beam (e-beam) or a mechanism of multiple e-beams is used to form a pattern on a mask (photomask or reticle) 823 based on the modified IC design layout diagram 811. Mask 823 can be formed in various technologies. In some embodiments, mask 823 is formed using binary technology. In some embodiments, a mask pattern includes opaque regions and transparent regions. A radiation beam, such as an ultraviolet (UV) beam, used to expose the image sensitive material layer (for example, photoresist) which has been coated on a wafer, is blocked by the opaque region and transmits through the transparent regions. In one example, a binary mask version of mask 823 includes a transparent substrate (for example, fused quartz) and an opaque material (for example, chromium) coated in the opaque regions of the binary mask. In another example, mask 823 is formed using a phase shift technology. In a phase shift mask (PSM) version of mask 823, various features in the pattern formed on the phase shift mask are configured to have proper phase difference to enhance the resolution and imaging quality. In various examples, the phase shift mask can be attenuated PSM or alternating PSM. The mask(s) generated by mask fabrication 822 is used in a variety of processes. For example, such a mask(s) is used in an ion implantation process to form various doped regions in semiconductor wafer 833, in an etching process to form various etching regions in semiconductor wafer 833, and/or in other suitable processes.

IC fab 830 includes wafer fabrication 832. IC fab 830 is an IC fabrication business that includes one or more manufacturing facilities for the fabrication of a variety of different IC products. In some embodiments, IC Fab 830 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 830 uses mask(s) 823 fabricated by mask house 820 to fabricate IC device 840. Thus, IC fab 830 at least indirectly uses IC design layout diagram 811 to fabricate IC device 840. In some embodiments, semiconductor wafer 833 is fabricated by IC fab 830 using mask(s) 823 to form IC device 840. In some embodiments, the IC fabrication includes performing one or more lithographic exposures based at least indirectly on IC design layout diagram 811. Semiconductor wafer 833 includes a silicon substrate or other proper substrate having material layers formed thereon. Semiconductor wafer 833 further includes one or more of various doped regions, dielectric features, multi-level interconnects, and the like (formed at subsequent manufacturing steps).

In some embodiments, an integrated circuit includes a diode string, a first transistor, a second transistor, and a third transistor. The diode string is coupled between a first reference voltage pin and an input/output (I/O) pad. The first transistor is coupled in parallel with the diode string. A first terminal of the first transistor is coupled to the I/O pad. A first terminal of the second transistor is coupled to a first node between two adjacent diodes in the diode string, and a gate terminal of the second transistor is coupled to a second reference voltage pin. A first terminal of the third transistor is coupled to a gate terminal of the first transistor, and a gate terminal of the third transistor is coupled to a second terminal of the second transistor. In response to a voltage at the first terminal of the second transistor being higher than a voltage at the gate terminal of the second transistor, the second transistor is configured to turn on the third transistor, and the third transistor is configured to transmit a voltage received from the first reference voltage pin to the gate terminal of the first transistor.

In some embodiments, the integrated circuit further includes at least one fourth transistor coupled in series with the first transistor between the I/O pad and the first reference voltage pin. A gate terminal of the at least one fourth transistor is floating.

In some embodiments, the at least one fourth transistor further includes a number N of fourth transistors stacked in a cascade connection, and n is a positive integer.

In some embodiments, the integrated circuit further includes a fourth transistor and a fifth transistor. A first terminal of the fourth transistor is coupled to the second terminal of the second transistor, a gate terminal of the fourth transistor is coupled to the second reference voltage pin, and a second terminal of the fourth transistor is coupled to the first reference voltage pin. A first terminal of the fifth transistor is coupled to the second reference voltage pin, a gate terminal of the fifth transistor is coupled to the second terminal of the second transistor, and a second terminal of the fifth transistor is coupled to the gate terminal of the first transistor.

In some embodiments, in response to the voltage at the gate terminal of the second transistor being higher than the voltage at the first terminal of the second transistor, the fourth transistor is configured to transmit the voltage received from the first reference voltage pin to the gate terminal of the fifth transistor, and the fifth transistor is configured to be turned on to transmit the voltage received from the second reference voltage pin to the gate terminal of the first transistor.

In some embodiments, the integrated circuit further includes a fourth transistor, a fourth transistor, a sixth transistor, and a seventh transistor. A first terminal of the fourth transistor is coupled to the second terminal of the second transistor, a gate terminal of the fourth transistor is coupled to the second reference voltage pin, and a second terminal of the fourth transistor is coupled to the first reference voltage pin. A first terminal of the fifth transistor is coupled to the second reference voltage pin, and a gate terminal of the fifth transistor is coupled to the second terminal of the second transistor. A first terminal of the sixth transistor is coupled to a second terminal of the fifth transistor, a gate terminal of the sixth transistor is coupled to the second terminal of the second transistor, and a second terminal of the sixth transistor is coupled to the gate terminal of the first transistor. A first terminal of the seventh transistor is coupled to the second terminal of the third transistor, a gate terminal of the seventh transistor is coupled to the second reference voltage pin, and a second terminal of the seventh transistor is coupled to the first reference voltage pin.

In some embodiments, in response to that no ESD event occurs on the I/O pad, the fourth transistor, the fifth transistor and the sixth transistor are turned on to connect the second reference voltage pin with the gate terminal of the first transistor.

In some embodiments, the integrated circuit further includes an eighth transistor, a ninth transistor, and a power clamp. A first terminal of the eighth transistor is coupled to the second reference voltage pin, a second terminal of the eighth transistor is coupled to the gate terminal of the first transistor, and a gate terminal of the eighth transistor is coupled to the first reference voltage pin. A first terminal of the ninth transistor is coupled to the gate terminal of the first transistor, a second terminal of the ninth transistor is coupled to the first reference voltage pin, and a gate terminal of the ninth transistor is coupled to the second terminal of the second transistor. The power clamp is coupled between the second reference voltage pin and the first reference voltage pin. In response to that an ESD event occurs from the I/O pad toward the second reference voltage pin, the eighth transistor is turned on to connect the second reference voltage pin with the gate terminal of the first transistor.

In some embodiments, the integrated circuit further includes a power clamp. The power clamp is coupled between a third reference voltage pin and the first reference voltage pin. In response to that an ESD event occurs from the I/O pad toward the third reference voltage pin, the power clamp is configured to guide an ESD current induced by the ESD event from the first reference voltage pin to the third reference voltage pin.

In some embodiments, a method includes: in response to a comparison between a first voltage at a first reference voltage pin and a second voltage at a first node coupled between an I/O pad and a second reference voltage pin, selectively transmitting the second voltage or a third voltage at the second reference voltage pin to gates of a first transistor and a second transistor that are coupled between the first reference voltage pin and the second reference voltage pin; controlling, in response to the second voltage or the third voltage that is transmitted, the first transistor or the second transistor to transmit the first voltage or the third voltage to an electrostatic discharge (ESD) primary circuit; and guiding, by the ESD primary circuit, an ESD current from the I/O pad to the second reference voltage pin.

In some embodiments, controlling the first transistor or the second transistor includes: transmitting, by the second transistor, the third voltage to the ESD primary circuit in response to the second voltage.

In some embodiments, controlling the first transistor or the second transistor includes: transmitting, by the first transistor, the first voltage to the ESD primary circuit in response to the third voltage.

In some embodiments, the method further includes: transmitting the first voltage to a gate of a third transistor that is coupled between the second transistor and the second reference voltage pin; and in response to that an ESD event occurs from the I/O pad toward a third reference voltage pin, controlling the third transistor and the second transistor to transmit a third voltage at the third reference voltage pin to the ESD primary circuit.

In some embodiments, the method further includes: transmitting the first voltage to a first terminal of a third transistor that is coupled between the first reference voltage pin and the second reference voltage pin; and in response to that an ESD event occurs from the I/O pad toward the first reference voltage pin, controlling the third transistor to transmit the first voltage to the ESD primary circuit.

In some embodiments, the method further includes: in response to the comparison between the first voltage and the second voltage, selectively transmitting the second voltage or the third voltage to a gate of a third transistor that is coupled between the ESD primary circuit and the second reference voltage pin; and in response to that an ESD event occurs from the I/O pad toward the second reference voltage pin, controlling the third transistor to transmit the third voltage to the ESD primary circuit.

In some embodiments, an integrated circuit includes an electrostatic discharge (ESD) primary circuit and a bias voltage generator. The ESD primary circuit is coupled between an input/output (I/O) pad and a first reference voltage pin. The bias voltage generator is coupled to the ESD primary circuit and includes a first transistor. The first transistor is coupled between the first reference voltage pin and a second reference voltage pin. In response to a voltage at the second reference voltage pin exceeding a threshold voltage of the first transistor, the first transistor is configured to transmit a voltage carried by the first reference voltage pin to turn on the ESD primary circuit.

In some embodiments, the bias voltage generator further includes a second transistor. A first terminal of the second transistor is coupled to the second reference voltage pin, a second terminal of the second transistor is coupled to the ESD primary circuit, and a gate terminal of the second transistor is coupled to the second reference voltage pin.

In some embodiments, in response to the voltage at the second reference voltage pin exceeding the threshold voltage of the first transistor, the voltage at the second reference voltage pin is pulled down to the voltage carried by the first reference voltage pin, and the second transistor is configured to transmit the voltage carried by the first reference voltage pin to the ESD primary circuit.

In some embodiments, the ESD primary circuit further includes a second transistor. A first terminal of the second transistor is coupled to the I/O pad. A threshold voltage of the ESD primary circuit is positively correlated to a voltage level on a gate terminal of the second transistor.

In some embodiments, the first transistor is further diode-connected between the first reference voltage pin and the ESD primary circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
a diode string coupled between a first reference voltage pin and an input/output (I/O) pad;
a first transistor coupled in parallel with the diode string, wherein a first terminal of the first transistor is coupled to the I/O pad;
a second transistor, wherein a first terminal of the second transistor is coupled to a first node between two adjacent diodes in the diode string, and a gate terminal of the second transistor is coupled to a second reference voltage pin; and
a third transistor, wherein a first terminal of the third transistor is coupled to a gate terminal of the first transistor, and a gate terminal of the third transistor is coupled to a second terminal of the second transistor,
wherein, in response to a voltage at the first terminal of the second transistor being higher than a voltage at the gate terminal of the second transistor, the second transistor is configured to turn on the third transistor, and the third transistor is configured to transmit a voltage received from the first reference voltage pin to the gate terminal of the first transistor.

2. The integrated circuit of claim 1, further comprising:
at least one fourth transistor coupled in series with the first transistor between the I/O pad and the first reference voltage pin,
wherein a gate terminal of the at least one fourth transistor is floating.

3. The integrated circuit of claim 2, wherein the at least one fourth transistor further comprises a number N of a plurality of fourth transistors stacked in a cascade connection, and n is a positive integer.

4. The integrated circuit of claim 1, further comprising:
a fourth transistor, wherein a first terminal of the fourth transistor is coupled to the second terminal of the second transistor, a gate terminal of the fourth transistor is coupled to the second reference voltage pin, and a second terminal of the fourth transistor is coupled to the first reference voltage pin; and
a fifth transistor, wherein a first terminal of the fifth transistor is coupled to the second reference voltage pin, a gate terminal of the fifth transistor is coupled to the second terminal of the second transistor, and a second terminal of the fifth transistor is coupled to the gate terminal of the first transistor.

5. The integrated circuit of claim 4, wherein
in response to the voltage at the gate terminal of the second transistor being higher than the voltage at the first terminal of the second transistor, the fourth transistor is configured to transmit the voltage received from the first reference voltage pin to the gate terminal of the fifth transistor, and
the fifth transistor is configured to be turned on to transmit the voltage received from the second reference voltage pin to the gate terminal of the first transistor.

6. The integrated circuit of claim 1, further comprising:
a fourth transistor, wherein a first terminal of the fourth transistor is coupled to the second terminal of the second transistor, a gate terminal of the fourth transistor is coupled to the second reference voltage pin, and a second terminal of the fourth transistor is coupled to the first reference voltage pin;
a fifth transistor, wherein a first terminal of the fifth transistor is coupled to the second reference voltage pin, and a gate terminal of the fifth transistor is coupled to the second terminal of the second transistor;

a sixth transistor, wherein a first terminal of the sixth transistor is coupled to a second terminal of the fifth transistor, a gate terminal of the sixth transistor is coupled to the second terminal of the second transistor, and a second terminal of the sixth transistor is coupled to the gate terminal of the first transistor; and
a seventh transistor, wherein a first terminal of the seventh transistor is coupled to the second terminal of the third transistor, a gate terminal of the seventh transistor is coupled to the second reference voltage pin, and a second terminal of the seventh transistor is coupled to the first reference voltage pin.

7. The integrated circuit of claim 6, wherein
in response to that no ESD event occurs on the I/O pad, the fourth transistor, the fifth transistor and the sixth transistor are turned on to connect the second reference voltage pin with the gate terminal of the first transistor.

8. The integrated circuit of claim 6, further comprising:
an eighth transistor, wherein a first terminal of the eighth transistor is coupled to the second reference voltage pin, a second terminal of the eighth transistor is coupled to the gate terminal of the first transistor, and a gate terminal of the eighth transistor is coupled to the first reference voltage pin;
a ninth transistor, wherein a first terminal of the ninth transistor is coupled to the gate terminal of the first transistor, a second terminal of the ninth transistor is coupled to the first reference voltage pin, and a gate terminal of the ninth transistor is coupled to the second terminal of the second transistor; and
a power clamp coupled between the second reference voltage pin and the first reference voltage pin,
wherein, in response to that an ESD event occurs from the I/O pad toward the second reference voltage pin, the eighth transistor is turned on to connect the second reference voltage pin with the gate terminal of the first transistor.

9. The integrated circuit of claim 6, further comprising:
a power clamp coupled between a third reference voltage pin and the first reference voltage pin,
wherein, in response to that an ESD event occurs from the I/O pad toward the third reference voltage pin, the power clamp is configured to guide an ESD current induced by the ESD event from the first reference voltage pin to the third reference voltage pin.

10. A method, comprising:
in response to a comparison between a first voltage at a first reference voltage pin and a second voltage at a first node coupled between an I/O pad and a second reference voltage pin, selectively transmitting the second voltage or a third voltage at the second reference voltage pin to gates of a first transistor and a second transistor that are coupled between the first reference voltage pin and the second reference voltage pin;
controlling, in response to the second voltage or the third voltage that is transmitted, the first transistor or the second transistor to transmit the first voltage or the third voltage to an electrostatic discharge (ESD) primary circuit; and
guiding, by the ESD primary circuit, an ESD current from the I/O pad to the second reference voltage pin.

11. The method of claim 10, wherein controlling the first transistor or the second transistor comprises:
transmitting, by the second transistor, the third voltage to the ESD primary circuit in response to the second voltage.

12. The method of claim 10, wherein controlling the first transistor or the second transistor comprises:
transmitting, by the first transistor, the first voltage to the ESD primary circuit in response to the third voltage.

13. The method of claim 10, further comprising:
transmitting the first voltage to a gate of a third transistor that is coupled between the second transistor and the second reference voltage pin; and
in response to that an ESD event occurs from the I/O pad toward a third reference voltage pin, controlling the third transistor and the second transistor to transmit a third voltage at the third reference voltage pin to the ESD primary circuit.

14. The method of claim 10, further comprising:
transmitting the first voltage to a first terminal of a third transistor that is coupled between the first reference voltage pin and the second reference voltage pin; and
in response to that an ESD event occurs from the I/O pad toward the first reference voltage pin, controlling the third transistor to transmit the first voltage to the ESD primary circuit.

15. The method of claim 10, further comprising:
in response to the comparison between the first voltage and the second voltage, selectively transmitting the second voltage or the third voltage to a gate of a third transistor that is coupled between the ESD primary circuit and the second reference voltage pin; and
in response to that an ESD event occurs from the I/O pad toward the second reference voltage pin, controlling the third transistor to transmit the third voltage to the ESD primary circuit.

16. An integrated circuit, comprising:
an electrostatic discharge (ESD) primary circuit coupled between an input/output (I/O) pad and a first reference voltage pin; and
a bias voltage generator coupled to the ESD primary circuit and comprising:
a first transistor coupled between the first reference voltage pin and a second reference voltage pin,
wherein, in response to a voltage at the second reference voltage pin exceeding a threshold voltage of the first transistor, the first transistor is configured to transmit a voltage carried by the first reference voltage pin to turn on the ESD primary circuit.

17. The integrated circuit of claim 16, wherein the bias voltage generator further comprises:
a second transistor, wherein a first terminal of the second transistor is coupled to the second reference voltage pin, a second terminal of the second transistor is coupled to the ESD primary circuit, and a gate terminal of the second transistor is coupled to the second reference voltage pin.

18. The integrated circuit of claim 17, wherein
in response to the voltage at the second reference voltage pin exceeding the threshold voltage of the first transistor, the voltage at the second reference voltage pin is pulled down to the voltage carried by the first reference voltage pin, and the second transistor is configured to transmit the voltage carried by the first reference voltage pin to the ESD primary circuit.

19. The integrated circuit of claim 16, wherein the ESD primary circuit further comprises:
a second transistor, wherein a first terminal of the second transistor is coupled to the I/O pad,
wherein a threshold voltage of the ESD primary circuit is positively correlated to a voltage level on a gate terminal of the second transistor.

20. The integrated circuit of claim 16, wherein the first transistor is further diode-connected between the first reference voltage pin and the ESD primary circuit.

* * * * *